United States Patent
Takahashi

(10) Patent No.: US 7,675,767 B2
(45) Date of Patent: Mar. 9, 2010

(54) SEMICONDUCTOR MEMORY DEVICE FOR ACHIEVING HIGH RELIABILITY WITHOUT INCREASING PROCESS COMPLEXITY AND COST

(75) Inventor: Hiroyuki Takahashi, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 150 days.

(21) Appl. No.: 11/598,713

(22) Filed: Nov. 14, 2006

(65) Prior Publication Data

US 2007/0109905 A1    May 17, 2007

(30) Foreign Application Priority Data

Nov. 15, 2005    (JP)    ............................. 2005-329883

(51) Int. Cl.
*G11C 11/24*    (2006.01)

(52) U.S. Cl. .................. 365/149; 365/230.06; 365/187; 365/188

(58) Field of Classification Search .................. 365/149, 365/230.06, 187, 188
See application file for complete search history.

(56) References Cited

U.S. PATENT DOCUMENTS

| | | | | |
|---|---|---|---|---|
| 5,732,017 | A * | 3/1998 | Schumann et al. | 365/185.11 |
| 6,118,695 | A * | 9/2000 | Yoneyama | 365/185.09 |
| 6,445,638 | B1 * | 9/2002 | Hsu et al. | 365/230.05 |
| 6,452,855 | B1 * | 9/2002 | Hsu et al. | 365/189.16 |
| 7,002,874 | B1 * | 2/2006 | Parris et al. | 365/230.06 |
| 7,236,413 | B2 * | 6/2007 | Nishihara | 365/200 |

FOREIGN PATENT DOCUMENTS

| | | |
|---|---|---|
| JP | 8-212772 | 8/1996 |
| JP | 2002-91831 | 3/2002 |

\* cited by examiner

*Primary Examiner*—Connie C Yoha
(74) *Attorney, Agent, or Firm*—Young & Thompson

(57) ABSTRACT

A semiconductor memory device is provided with a DRAM array and a control circuit. The DRAM array includes first and second storage areas. The control circuit controls an access to said DRAM array so that data hold characteristics of said first storage area are superior to those of said second storage area.

13 Claims, 5 Drawing Sheets

SEMICONDUCTOR MEMORY DEVICE FOR ACHIEVING HIGH RELIABILITY WITHOUT INCREASING PROCESS COMPLEXITY AND COST

BACKGROUND OF THE INVENTION

1. Field of the Invention

The present invention relates to a semiconductor memory device, more particularly, to a semiconductor memory device incorporating a DRAM (dynamic random access memory") array and an operating method thereof.

2. Description of the Related Art

There are two types of semiconductor memories: a non-volatile memory such as a flash memory, and a volatile memory, such as a DRAM. For both types of the semiconductor memories, one of most important problems is improvement in data hold characteristics (that is, data retention reliability). Factors affecting on data hold characteristics depend on the type of memory.

One issue for the flash memory is deterioration of the tunnel oxide film caused by repeated data write operations; the degradation of a tunnel oxide film makes it difficult to hold electrons and holes injected into the floating gate. The deterioration of the data hold characteristics in the flash memory is generally caused by the degradation of the tunnel oxide film, and therefore, the deterioration of the data hold characteristics is an "irreversible change". One approach of maintaining the data hold characteristics is to replace degraded cells with redundant cells. Another known approach is use of an external ECC (error correction code) circuit. For example, Japanese Laid-Open Patent application No. JP-A 2002-91831 discloses a flash memory using a software ECC for specific ones of storage areas. This allows virtually avoiding the deterioration of the data hold characteristics when tunnel oxide films are degraded. In other words, the allowed number of times of rewriting data into the specific storage areas, to which the ECC is applied, is increased compared with the remaining storage areas.

As for the DRAM, on the other hand, data corruption is mainly caused by leakage of electric charges from cell capacitors, since cell data are stored as electric charges by the cell capacitors. To avoid the data corruption, data refreshing is repeatedly performed at certain time intervals in the DRAM. The data refreshing allows the cell capacitors to be recharged with electric charges.

As thus described, data hold characteristics of the DRAM, which depend on the quantity of electric charges accumulated in the cell capacitors, are not irreversibly deteriorated. One approach for improving the data hold characteristics is to increase accumulated electric charges, for example, by increasing the capacitance of the cell capacitors. Japanese Laid Open Patent Application No. JP-A Heisei 8-212772 discloses such DRAM in which the pitches of word lines and bit lines in a highly reliable area requiring high reliability are larger than those in other areas. This allows increasing the capacitance of cell capacitors in the highly reliable area, and thereby increasing the electric charges accumulated in the cell capacitors.

Nevertheless, the DRAM disclosed in this Laid Open Patent Application undesirably increases the complexity of the manufacture process, according to the investigation of the inventor of the present invention. In the disclosed DRAM, in which the pitches of word lines and bit lines in the highly reliable area are larger than those in other areas, the shape of the memory cells is different between the highly reliable area and the other areas. Integrating differently-shaped memory cells within a single chip undesirably decreases the manufacture process uniformity over the chip, and therefore increases the complexity of the manufacture process.

SUMMARY OF THE INVENTION

In an aspect of the present invention, a semiconductor memory device is provided with a DRAM array and a control circuit. The DRAM array includes first and second storage areas. The control circuit controls accesses to the DRAM array so that data hold characteristics of the first storage area is superior to those of the second storage area.

In a preferred embodiment, the control circuit performs a data access to the first storage area in units of access units each including a plurality of memory cells, and performs a data access to the second storage area in units of memory cells.

In one embodiment, each access unit within the first storage area is composed of first and second memory cells respectively connected to first and second bit lines. The first and second bit lines are connected to the same sense amplifier. When the data "H" is written into a selected access unit, two word lines connected to two memory cells belonging to the access unit are selected at the same time, and the data "H" is then written into the first memory cell, while the complementary data "L" is written into the second memory cell.

In a read operation from the access unit, the two word lines are selected at the same time after the first and second bit lines are precharged. This results in that the a higher voltage level corresponding to the data "H" is developed on the first bit line, and a lower voltage level corresponding to the data "L" is developed on the second bit line. The sense amplifier identifies the data stored in the access unit on the basis of the difference between the voltage levels on the first and second bit lines.

In a typical data read operation in a conventional DRAM, only one word line is selected in a write operation. When a memory cell storing the data "H" is selected, a voltage level corresponding to the data "H" is developed on a bit line connected to the selected memory cell. The sense amplifier identifies the data stored in the selected memory cell from the difference between the voltage level on the bit line and the half of the power supply level. The voltage level on the bit line, however, is decreased as electric charges are leaked from the cell capacitor of the selected memory cell, and the sensing performance of the sense amplifier is degraded. In the worst case, the voltage level on the bit line is decreased below the half of the power supply level, and the sense amplifier erroneously identifies the data stored in the selected memory cell as the data "L".

In the semiconductor memory device in accordance with the present invention, on the other hand, the data stored in the selected access unit is identified on the basis of the voltage level on the first bit line, which voltage level is originally higher than the half of the power supply voltage, and the voltage level on the second bit line, which is definitely lower than the half of the power supply voltage. Although the voltage level on the first bit line may be decreased due to the leakage of the electric charges from the cell capacitor, the sensing performance of the sense amplifier is maintained because of the sufficient difference of the voltage levels on the first and second bit lines. Even when the voltage level on the first bit line is decreased below the half of the power supply level, the sense amplifier can correctly identifies the data stored in the access unit as the data "H", as long as the voltage level on the first bit line is higher than that on the second bit line.

As thus described, the semiconductor memory device in accordance with the present invention is designed so that the data hold characteristics of the first storage area, that is, data retention reliability of the first storage area is selectively improved compared with the second storage area. In a preferred application, important data for the system operation, such as programs, are stored in the first storage area with the high reliability, while image and/or audio data to be processed by the programs are stored in the second storage area. Such application is advantageous because corruption of the programs is fatal for the system operation, while corruption of other data does not usually cause system freeze. The present invention allows partially improving data storage reliability of the DRAM array depending on the types of the data to be stored. The present invention avoids an unnecessary increase of the chip size and cost, since the reliability is not improved over the whole of the DRAM array.

Additionally, the present invention eliminates the need for integrating differently-shaped memory cells in a single memory chip for partially improving the reliability of the memory; the present invention can be implemented by selecting multiple word lines in the first storage area at the same time, even when all the memory cells have the same structure. The fact that all the memory cells have the same structure is preferable for avoiding the use of complicated manufacture processes.

BRIEF DESCRIPTION OF THE DRAWINGS

The above and other advantages and features of the present invention will be more apparent from the following description taken in conjunction with the accompanied drawings, in which.

DESCRIPTION OF THE PREFERRED EMBODIMENTS

The invention will be now described herein with reference to illustrative embodiments. Those skilled in the art would recognize that many alternative embodiments can be accomplished using the teachings of the present invention and that the invention is not limited to the embodiments illustrated for explanatory purposed.

Figure 1:
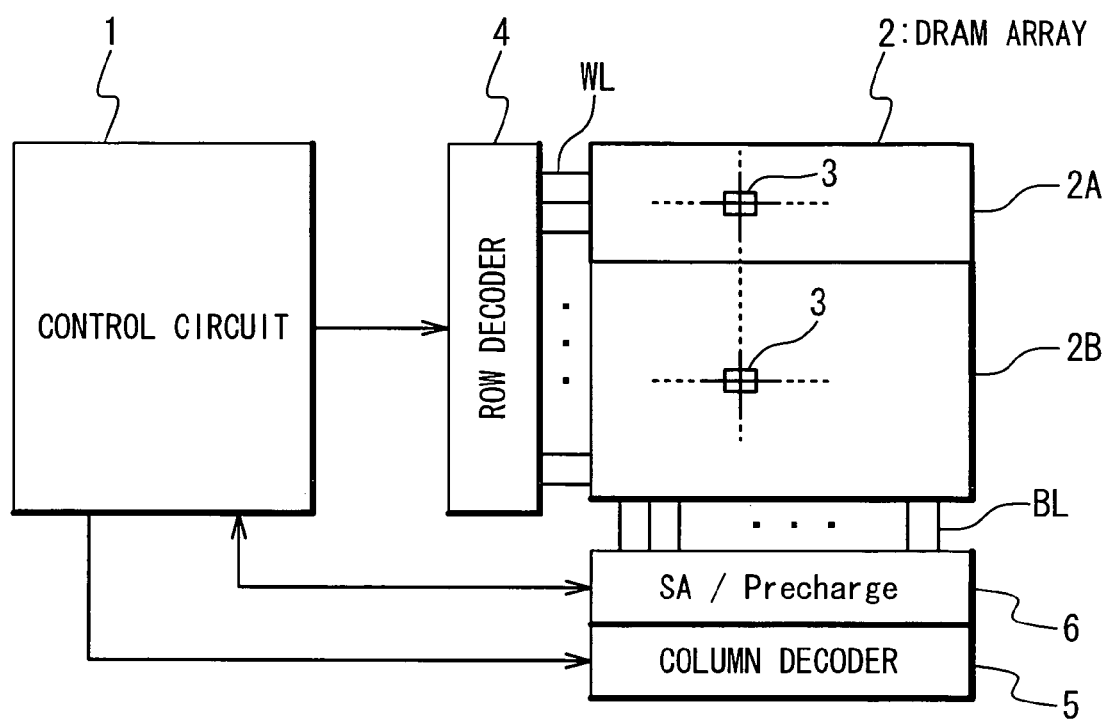
FIG. 1 is a block diagram schematically illustrating the configuration of a semiconductor memory device in embodiments of the present invention.

FIG. 1 is a block diagram schematically illustrating a preferred structure of a semiconductor memory device in accordance with the present invention. The semiconductor memory device shown in FIG. 1 is provided with a DRAM array 2, which requires data refreshing. The DRAM array 2 includes an array of memory cells 3, a set of word lines WL, and set of bit lines BL. The word lines WL and the bit lines BL intersect with each other, and the memory cells 3 are arranged at respective intersections of the word lines WL and the bit lines BL. The memory cells 3 have the same structure.

Connected to the word lines WL is a row decoder 4 which selects the word lines WL. Additionally, a column decoder 5 and a sense amplifier 6 are connected to the bit lines BL. The column decoder 5 selects the bit lines BL, and the sense amplifier 6 identifies cell data stored in the memory cells 3 from voltage levels of the bit lines BL, and externally outputs the identified cell data. The sense amplifier 6 includes a precharging circuit (not shown) for precharging the bit lines BL to a predetermined voltage level. A control circuit 1 feeds an address signal and control signals to the row decoder 4, the column decoder 5 and the sense amplifier 6, thereby controlling the access to the DRAM array 2.

The DRAM array 2 is divided into a plurality of areas having different data hold characteristics. In this embodiment, the DRAM array 2 is divided into a first storage area 2A and a second storage area 2B. The DRAM array 2 is designed so that data hold characteristics of the first storage area 2A are better than those of the second storage area 2B; the data retention reliability of the first storage area 2A is superior to that of the second storage area 2B. The first storage area 2A, which has the higher reliability, is preferably used as, for example, a program area in which important data such as program codes are stored from the viewpoint of the system operation. In contrast, the second storage area 2B, which has the normal reliability, is preferably used as, for example, a work area in which image data and/or voice data are stored. This effectively avoids system freeze; the corruption of a program code is often fatal to the system operation, while the corruption temporary data does not usually cause system freeze.

As thus described, the DRAM array 2 in accordance with the present invention is divided into a plurality of areas depending on the purposes. In other words, the data hold characteristics (i.e., the data retention reliability) are partially improved in accordance with the type or quality of data to be stored. In the example illustrated in FIG. 1, the control circuit 1 controls data access to the DRAM array 2 so that the data hold characteristics of the first storage area 2A is superior to those of the second storage area 2B. It should be noted that only a portion of the DRAM array 2 is designed to exhibit superior data hold characteristics, since the improvement in the data hold characteristics of the whole of the DRAM array 2 is inefficient from the viewpoint of the chip size and cost.

An explanation will be given below in details on the control by the control circuit 1 for enhancing the data hold characteristics of only a portion of the DRAM array 2.

First Embodiment

In a first embodiment, a set of n memory cells 3 (n is an integer of 2 or more) are regarded as one "access unit", when data access is implemented to the first storage area 2A, in which high reliability is desired. Specifically, the control circuit 1 writes the same or complementary data into a set of n memory cells 3 belonging to the same access unit, and identifies data stored in the access unit on the basis of the electric charges accumulated in the set of n memory cells 3. When data access to the second storage area 2B is implemented, on the other hand, one single memory cell 3 is regarded as one "access unit", as is the case of commonly-used DRAMs.

Figure 2:
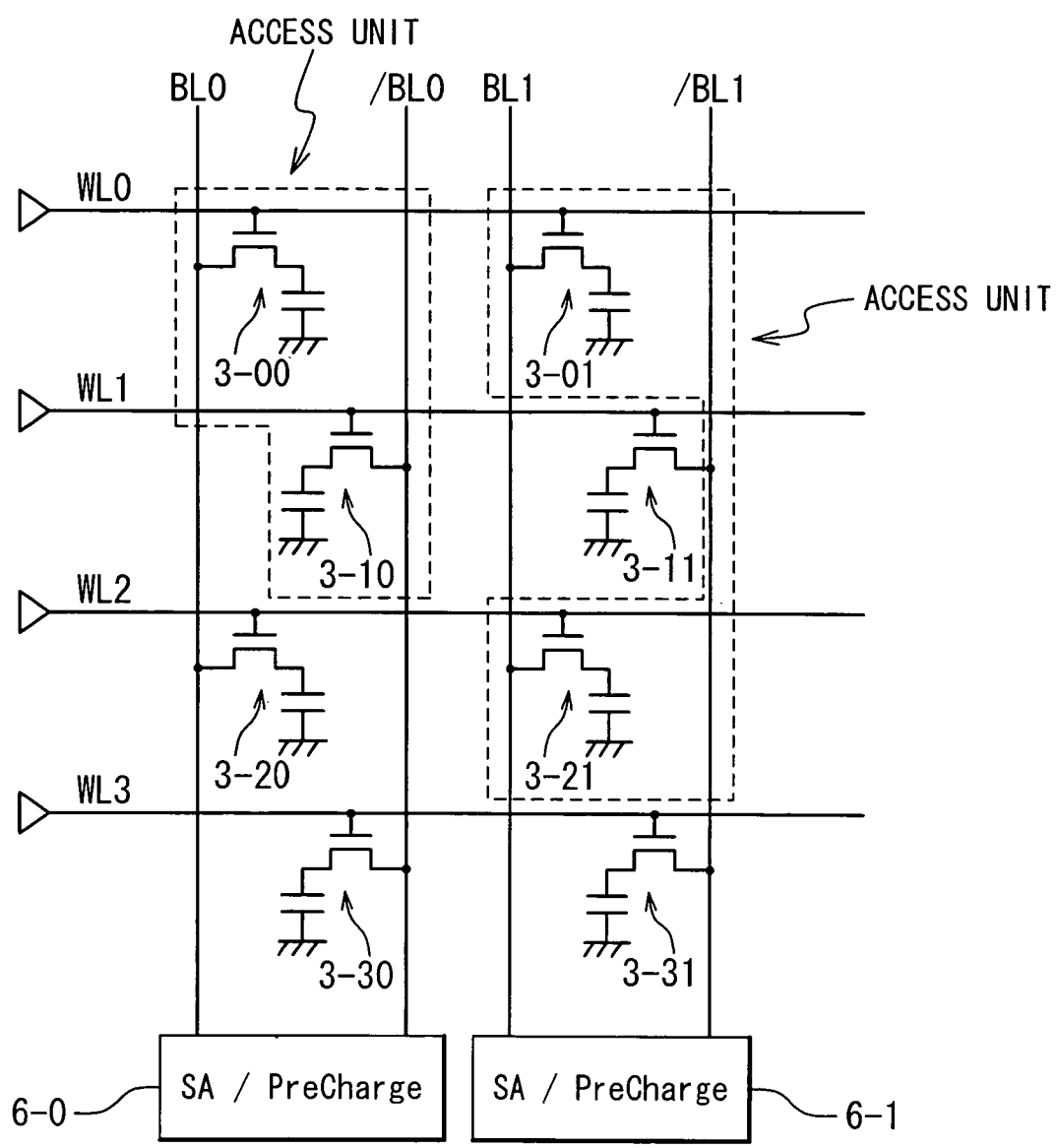
FIG. 2 is a diagram illustrating a method of an access to a DRAM in a first embodiment of the present invention.

FIG. 2 is a circuit diagram partially illustrating the structure of the DRAM array 2 in the first storage area 2A, in which high reliability is desired. Word lines WL0 to WL3 and bit lines BL0, /BL0, BL1 and /BL1 are arranged to intersect with each other, and memory cells 3-00 to 3-31 are arranged at the respective intersections. The memory cells 3 are each provided with an MOS transistor and a cell capacitor. The gate of the MOS transistor of each memory cell 3 is connected with associated one of the word lines WL. One of the source and drain of the MOS transistor is connected to associated one of the bit lines BL, and the other is connected to the cell capacitor. The bit lines BL0 and /BL0, which are connected to the same sense amplifier 6-0, constitute a complementary bit line pair. Correspondingly, the bit lines BL1 and /BL1, connected to the same sense amplifier 6-1, constitute a complementary bit line pair.

The DRAM structure described above is same as that of a conventional DRAM; the difference is that a set of n memory cells 3 are regarded as one access unit during data access in this embodiment. For example, two memory cells 3-00 and 3-10 are regarded as one access unit. It should be noted that the memory cells 3-00 and 3-10 are respectively connected to the different word lines WL0 and WL1, while the memory cells 3-00 and 3-10 are respectively connected to the complementary bit lines BL0 and /BL0, which are connected to the same sense amplifier 6-0.

When the data "H" is written into the access unit composed of the two memory cells 3-00 and 3-10, for example, the control circuit 1 selects the two word lines WL0 and WL1 connected to the memory cells 3-00 and 3-10 of the access unit at the same time. Such selection may be referred to as "multiple selection", hereinafter. After the multiple selection, the data "H" is written into the memory cell 3-00 through the bit line BL0, while the complementary data "L" is written into the other memory cell 3-10 through the bit line /BL0. It should be noted that the bit lines BL0 and /BL0 form a complementary bit line pair, and the word lines WL0 and WL1 are selected at the same time.

Figure 3:
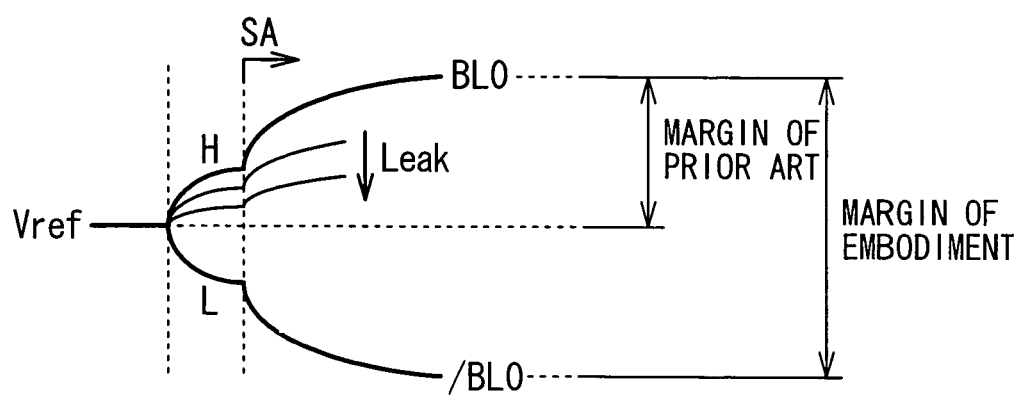
FIG. 3 is a timing chart illustrating an exemplary reading operation in the first embodiment.

The read operation of the data stored in the access unit composed of the two memory cells 3-00 and 3-10 is as follows: Referring to FIGS. 2 and 3, the bit lines BL0 and /BL0 are first precharged to a reference voltage level Vref by a precharging circuit within the sense amplifier 6-0. The reference voltage level Vref is typically VCC/2, that is, the middle voltage level of the power supply level VCC and the ground level GND. After the precharge, the control circuit 1 then selects the word lines WL0 and WL1 at the same time. As a result, a higher voltage level corresponding to the data "H" is developed on the bit line BL0, while a lower voltage level corresponding to the data "L" is developed on the bit line /BL0. The sense amplifier 6-0 amplifies the difference between the higher and lower voltage levels developed on the bit lines BL0 and /BL0, thereby identifying the data stored in the relevant access unit as the data "H". The difference between the higher and lower voltage levels developed on the bit lines BL0 and /BL0 is the margin achieved by the semiconductor memory device in this embodiment in FIG. 3.

In a typical data read operation in a conventional DRAM, only one word line is selected, as is the case of the second storage area 2B. In detail, the bit lines BL0 and /BL0 are first precharged to the reference voltage level Vref by the precharging circuit within the sense amplifier 6-0, and the memory cell 3-00, having the data "H" written therein, is then selected. This results in that the higher voltage level corresponding to the data "H" is developed on the bit line BL0. The sense amplifier 6-0 identifies the data stored in the memory cell 3-00 on the basis of the difference between the higher voltage level developed on the bit line BL and the reference voltage level Vref. The difference between the higher voltage level developed on the bit line BL0 and the reference voltage level Vref is the margin achieved by the prior art shown in FIG. 3. One issue is the charge leakage from the cell capacitor. The higher voltage level developed on the bit line BL0 is decreased due to the charge leakage, and this degrades the sensing performance. In the worst case, the data stored in the selected memory cell 3-00 may be erroneously identified as the data "L", which is complementary to the original data, when the voltage level on the bit line BL0 is decreased below the reference potential Vref.

In this embodiment, on the other hand, the stored data is identified on the basis of the difference between the higher voltage level corresponding to the data "H" and the lower voltage level corresponding to the data "L", as described above. Consequently, a sufficient data read margin is provided even when the higher voltage level is reduced due to the leakage of electric charges from the cell capacitor of the memory cell 3-00. This improves the sensing performance of the sense amplifier 6-0. Even when the higher voltage level developed on the bit line BL is reduced below the reference voltage level Vref, the data "H" is successfully identified as long as the voltage level on the bit line BL0 is higher than the voltage level on the bit line /BL0. This reduces the possibility of unsuccessful data read, effectively improves the data hold characteristics of the first storage area 2A.

It should be noted that no electric charge could be leaked from the cell capacitor of a memory cell storing the data "L", although electric charges may be leaked from the cell capacitor of a memory cell storing to the data "H". In this sense, the data hold characteristics (i.e., data retention reliability) of the memory cell storing the data "L" are excellent. The lower voltage level developed on a bit line corresponding to the data "L" is definitely lower than the reference voltage level Vref. In other words, the use of the lower voltage level for storing and identifying the data "H" in place of the reference potential Vref effectively improves the sensing performance in the embodiment illustrated in FIG. 3.

In an alternative embodiment, an access unit may be composed of two memory cells connected to the same bit line, instead of the two memory cells respectively connected to the complementary bit lines. Referring back to FIG. 2, for example, the two memory cells 3-01 and 3-21 connected to the bit line BL1 may be regarded as one access unit. When the data "H" is written in the access unit composed of the memory cells 3-01 and 3-21, the control circuit 1 selects the two word lines WL0 and WL2 associated with the memory cells 3-01 and 3-21, respectively. As a consequence, the data "H" is written into both of the memory cells 3-01 and 3-21.

Figure 4:
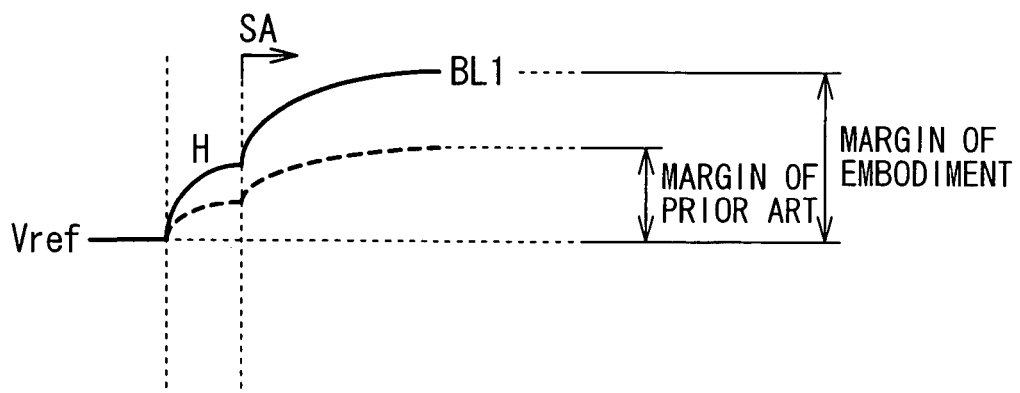
FIG. 4 is a timing chart illustrating another exemplary reading operation in the first embodiment.

The data read operation from the access unit composed of the memory cells 3-01 and 3-21 is as follows: the bit lines BL1 and /BL1 are first precharged to the reference voltage level Vref by the precharging circuit within the sense amplifier 6-1, as shown in FIGS. 2 and 4. The control circuit 1 then selects the two word lines WL0 and WL2 at the same time. This results in that a voltage level corresponding to the data "H" is developed on the bit line BL1. The sense amplifier 6-1 amplifies the difference between the voltage level developed on the bit line BL1 and the reference voltage level Vref, thereby identifying the data stored in the relevant access unit as the data "H". In this case, the voltage level developed on the bit line BL1 (i.e., the margin of the embodiment shown in FIG. 4) increases as the increase in the sum of electric charges accumulated in the memory cells 3-01 and 3-21, which is higher than that in a normal case where only one memory cell is selected (i.e., the margin of the prior art shown in FIG. 4). As a consequence, the possibility of unsuccessful data read is effectively reduced, even when electric charges are leaked from the cell capacitor.

Although, a set of two memory cells 3 are regarded as one access unit in the above-described embodiments, three or more memory cells 3 may be regarded as one access unit. The memory cells 3 belonging to the same access unit are connected to the bit lines BL connected to the same sense amplifier 6. When data access to an access unit is implemented, multiple word lines WL associated with the access unit are selected. This achieves both of the effects shown in FIGS. 3 and 4, thus further improving the data hold characteristics. It should be noted, however, that one access unit is preferably composed of two memory cells from the viewpoint of increasing the number of access units per unit area.

As described above, the semiconductor memory device in this embodiment is designed to select multiple word lines WL in the first area 2A in data access, while selecting one word line WL in the second area 2B. It should be noted that switching between the multiple selection and the single selection can be easily achieved through circuit design in the row decoder 4. The multiple selection effectively improves the data hold characteristics (i.e., the data retention reliability) in the first area 2A, thus enhancing the data storage reliability in the first area 2A. In other words, the reliability of the DRAM array 2 can be partially enhanced in this embodiment. Although a storage capacity per unit area in the first area 2A is smaller than that in the second area 2B, the data hold characteristics of the first area 2A is effectively improved up to about the triple of the data hold characteristics of the second area 2B. Such design advantageously suppresses an undesired increase in chip size and in cost, since data hold characteristics are not enhanced over the whole of the DRAM array 2.

It should be noted that the semiconductor memory device does not require manufacturing memory cells into different shapes for enhancing the data storage reliability. Although all of the memory cells 3 have the same structure, this embodiment can be implemented only by selecting multiple word lines WL in the first area 2A.

Figure 5:
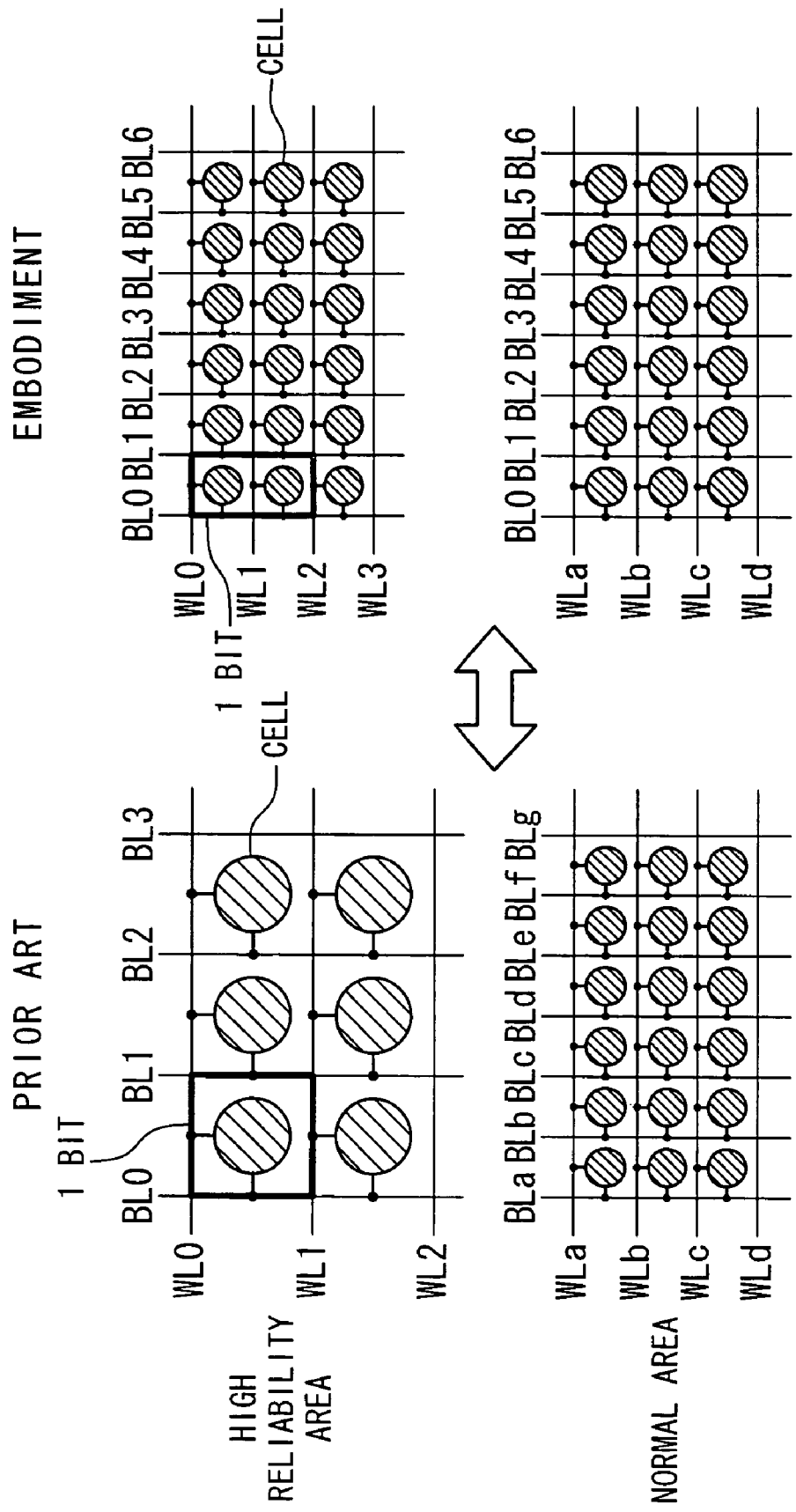
FIG. 5 is a diagram schematically illustrating the comparison between the prior art and the semiconductor memory device in the first embodiment of the present invention.

FIG. 5 illustrates the comparison between the configuration of the conventional memory cell array disclosed in Japanese Laid Open Patent Application No. JP-A Heisei 8-212772 2 and the configuration of the memory cell array in this embodiment. In the conventional technique, the pitches of the word lines WL and the bit lines BL in the highly reliable area are larger than those in the normal area. As a consequence, the design rules are alleviated and the cell capacitor size is increased in the highly reliable area. This increases the capacitance of the cell capacitors and thereby improves the data hold characteristics; however, this technique undesirably requires integrating differently-shaped cells in a single semiconductor substrate, and undesirably increases the manufacture process complexity. In particular, finely patterning memory cells having different shapes is quite difficult. In this embodiment, on the other hand, the memory cells have the same structure in the highly reliable area and the normal area. This effectively avoids increasing the manufacture process complexity.

More specifically, the conventional technique uses one cell larger than a usual cell to store one bit data in the highly reliable area. For example, as illustrated in FIG. 5, one word line is selected in accessing the 1-bit data. In contrast, the semiconductor memory device in this embodiment uses a set of multiple cells to store 1-bit data in the highly reliable area. For example, as illustrated in FIG. 5, the two word lines WL0 and WL1 are selected in accessing the 1-bit data. Although the number of stored bits per unit area is reduced, like in the conventional technique, the device in this embodiment remarkably facilitates the manufacture process.

Moreover, the conventional technique requires separately preparing sense amplifiers in the highly reliable area and the normal area, since the arrangement pitch of the bit lines BL0 to BL3 in the highly reliable area is different from that of bit lines BLa to BLg in the normal area. In the semiconductor memory device in this embodiment, on the other hand, the arrangement pitch of the bit lines BL0 to BL6 is same in both of the highly reliable area and the normal area, so that the bit lines BL0 to BL6 can be commonly used. This eliminates the need for separately preparing sense amplifiers in the highly reliable area and the normal area, so that a sense amplifier can be commonly used.

Second Embodiment

Figure 6:
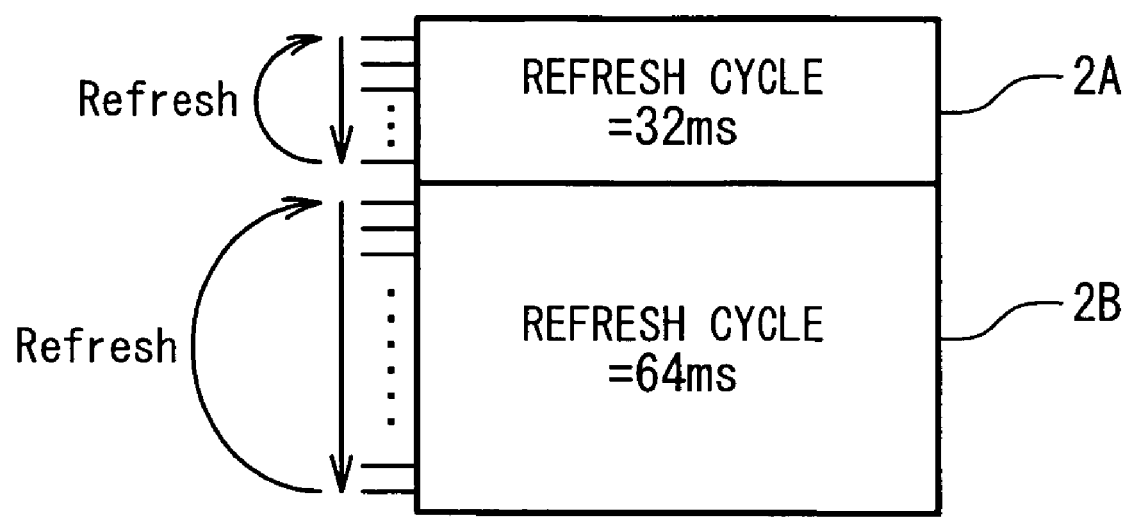
FIG. 6 is a diagram illustrating a refreshing operation in a second embodiment of the present invention.

FIG. 6 is a diagram illustrating a control method in a second embodiment. In the second embodiment, the control circuit 1 performs different refreshing controls with respect to the first storage area 2A and the second storage area 2B. Specifically, the control circuit 1 refreshes the memory cells within the second storage area 2B at a normal refresh cycle (e.g., 64 ms), while refreshing the memory cells within the first storage area 2A, in which the high reliability is required, at a shorter refresh cycle (e.g., 32 ms). In other words, the refreshing is implemented in the first storage area 2A more frequently than in the second storage area 2B. This allows the first storage area 2A to exhibit superior data hold characteristics, compared to those in the second storage area 2B.

Data refreshing at different refresh cycles may be performed as follows: In one embodiment, the memory cells within the first storage area 2A and the second storage area 2B are refreshed in parallel by using separate refresh timers, as illustrated in FIG. 6. In this case, a certain word line in the first storage area 2A may be driven at the same time as a certain word line in the second storage area 2B. In an alternative embodiment, a refresh timer set to 32 ms may be used for refreshing over the whole of the DRAM array 2, and the expiration of the refresh timer may be neglected once per twice with respect to the second storage area 2B. In this case, the word lines may be driven one by one.

As described above, memory cells in a portion of the memory array are refreshed at a shorter refresh cycle in this embodiment. This effectively enhances the data storage reliability of only a portion of the DRAM array 2. The approach in this embodiment is superior to the first embodiment in that the number of stored data bits per unit area in the highly reliable area is not reduced. When the first storage area 2A (i.e., a program area) is relatively small, the increase in the standby current caused by the increased refresh frequency causes no serious influence. Moreover, all of memory cells 3 also have the same structure in this embodiment, and therefore the effect illustrated in FIG. 5 is also achieved.

It should be noted that the technique described in the first and second embodiments may be combined with each other. This effectively enhances the data storage reliability of the first storage area 2A.

It is apparent that the present invention is not limited to the above-described embodiments, which may be modified and changed without departing from the scope of the invention.

What is claimed is:

1. A semiconductor memory device comprising:
  a DRAM array including first and second storage areas; and
  a control circuit controlling an access to said DRAM array so that data hold characteristics of said first storage area are superior to those of said second storage area,
  wherein said control circuit performs an access to said first storage area in units of access units each comprising n memory cells, n being an integer of 2 or more, while performing an access to said second storage area in units of memory cells, said n being two, said two memory cells are connected to a pair of complementary bit lines, respectively, said complementary bit lines being connected to the same sense amplifier, and data stored in said first and second storage areas is externally outputted through the same sense amplifier.

2. The semiconductor memory device according to claim 1, wherein all of memory cells within said DRAM array have the same structure.

3. The semiconductor memory device according to claim 1, wherein said first storage area comprising:

a plurality of memory cells; and a plurality of word lines connected to said plurality of memory cells, respectively, wherein said control circuit selects n word lines out of said plurality of word lines during a write operation, n being an integer of two or more.

4. The semiconductor memory device according to claim 3, wherein said n word lines including:

a first word line connected to a first memory cell out of said plurality of memory cells; and a second word line connected to a second memory cell out of said plurality of memory cells, wherein said first memory cell is connected to a first bit line, and wherein said second memory cell is connected to a second bit line.

5. The semiconductor memory device according to claim 4, wherein said first and second bit lines constitutes a complementary bit line pair.

6. The semiconductor memory device according to claim 3, wherein said n word lines including:

a first word line connected to a first memory cell out of said plurality of memory cells; and a second word line connected to a second memory cell out of said plurality of memory cells, wherein said first and second memory cells are connected to the same bit line.

7. A semiconductor memory device comprising:

a DRAM array including first and second storage areas;

a control circuit controlling an access to said DRAM array so that data hold characteristics of said first storage area are superior to those of said second storage area wherein said control circuit performs refreshing with respect to said first storage area more frequently than refreshing with respect to said second storage area; and data stored in said first and second storage areas is externally outputted through a same sense amplifier.

8. A method of operating a semiconductor memory device including a DRAM array provided with first and second storage areas, said method comprising:

controlling an access to said DRAM array so that data hold characteristics of said first storage area are superior to those of said second storage area, wherein said controlling includes:

performing an access to said first storage area in units of access units each comprising n memory cells, n being an integer of two or more; and performing an access to said second storage area in units of memory cells, said n being two, said two memory cells are connected to a pair of complementary bit lines, respectively, said complementary bit lines being connected to the same sense amplifier, and data stored in said first and second storage areas is externally outputted through the same sense amplifier.

9. The method according to claim 8, wherein said first storage area comprising n word lines connected to said n memory cells, respectively; and said performing said access to said first storage area includes selecting said n word lines at the same time.

10. The method according to claim 8, wherein said controlling includes:

performing data refreshing with respect to said first storage area at a first refresh cycle; and performing data refreshing with respect to said second storage area at a second refresh cycle longer than said first refresh cycle.

11. The method according to claim 8, wherein the type of data stored in said first storage area is of a higher quality than the type of data stored in said second storage area.

12. The semiconductor memory device according to claim 7, wherein said control circuit includes two separate refresh timers respectively associated with said first and second storage areas.

13. The semiconductor memory device according to claim 7, wherein said refreshing with respect to first and second storage areas are controlled by said control circuit with said first and second storage areas placed in the same operation mode.

* * * * *